United States Patent
Cichon et al.

(10) Patent No.: US 12,332,324 B2
(45) Date of Patent: Jun. 17, 2025

(54) APPARATUS AND METHOD FOR CALIBRATING A MAGNETIC SENSOR SYSTEM USING AN INHOMOGENEOUS MAGNETIC FIELD SOURCE

(71) Applicant: Fraunhofer-Gesellschaft zur Foerderung der angewandten Forschung e.V., Munich (DE)

(72) Inventors: Daniel Cichon, Erlangen (DE); Philip Beran, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 223 days.

(21) Appl. No.: 17/950,751

(22) Filed: Sep. 22, 2022

(65) Prior Publication Data
US 2023/0090679 A1    Mar. 23, 2023

(30) Foreign Application Priority Data
Sep. 22, 2021    (DE) .......................... 102021210552.1

(51) Int. Cl.
    *G01R 33/00*     (2006.01)
    *G01R 33/02*     (2006.01)
    *G01R 33/07*     (2006.01)

(52) U.S. Cl.
    CPC ..... *G01R 33/0035* (2013.01); *G01R 33/0206* (2013.01); *G01R 33/07* (2013.01)

(58) Field of Classification Search
    CPC ............ G01R 33/0035; G01R 33/0206; G01R 33/07; G01R 33/0017
See application file for complete search history.

(56) References Cited

U.S. PATENT DOCUMENTS 7,932,718 B1 *    4/2011    Wiegert ................. G01V 3/081
                                                                                           324/245
9,885,574 B2      2/2018    Moore et al.
(Continued)

FOREIGN PATENT DOCUMENTS

DE     102010029668 A1    12/2011
DE     102012203001 A1     8/2012
(Continued)

OTHER PUBLICATIONS

Beravs, et al., Magnetometer Calibration Using Kalman Filter; IEEE Transactions on Instrumentation and Measurement, vol. 63, No. 8, Aug. 2014.
(Continued)

*Primary Examiner* — Alvaro E Fortich
(74) *Attorney, Agent, or Firm* — PERKINS COIE LLP; Michael A. Glenn

(57) ABSTRACT

The invention relates to an apparatus as well as a method for calibrating a magnetic sensor system including at least one magnetic field source and one magnetic field sensor arrangement with several individual magnetic field sensors. Here, a plurality of individual measurements is performed, wherein each individual measurement provides a number of measurement values depending on the number of the individual magnetic field sensors. The magnetic field of the magnetic field source is varied at the location of the magnetic field sensor arrangement between two successive individual measurements. Based on the measurement values and by applying an optimization or estimation method, one or several magnetic field sensor-specific parameters and/or magnetic
(Continued)

field source-specific parameters are determined, which are used as correction values for calibrating the magnetic sensor system. According to the invention, a magnetic field source is used that generates an inhomogeneous magnetic field.

19 Claims, 5 Drawing Sheets

(56) References Cited

U.S. PATENT DOCUMENTS

| | | | |
|---|---|---|---|
| 2003/0107366 A1 | 6/2003 | Busch et al. | |
| 2011/0301897 A1 | 12/2011 | Weiss et al. | |
| 2012/0056615 A1* | 3/2012 | Ausserlechner | ... G01R 33/1207 324/202 |
| 2012/0217960 A1* | 8/2012 | Ausserlechner | ....... H10N 50/10 324/252 |
| 2017/0261565 A1 | 9/2017 | Ausserlechner | |
| 2020/0116801 A1* | 4/2020 | Watanabe | ............... G01R 33/07 |

FOREIGN PATENT DOCUMENTS

| | | |
|---|---|---|
| DE | 102015203686 A1 | 9/2016 |
| DE | 102019126872 A1 | 4/2020 |
| EP | 0225493 A3 | 5/1989 |
| EP | 0382290 A1 | 8/1990 |
| EP | 1518131 A1 | 3/2005 |
| EP | 2131205 A1 | 12/2009 |
| EP | 2939601 A2 | 11/2015 |
| WO | 2016139135 A1 | 9/2016 |
| WO | 2020002220 A1 | 1/2020 |

OTHER PUBLICATIONS

Bronaugh, Edwin L., et al., Coils for Calibration of Probes and Sensors: Limits of Magnetic Field Accuracy and Uniformity ISEMC. 1995.

Engel-Herbert, R, Calculation of the magnetic stray field of a uniaxial magnetic domain . . . 2004.

Lassahn, M.P, et al., Vectorial Calibration of 3D Magnetic Field Sensor Arrays, IEEE Transactions on Instrumentation and Measurement, vol. 44. No. 2, Apr. 1995.

McPherron, Robert, et al., A Procedure for Accurate Calibration of the Orientation of the Three Sensors in a Vector Magnetometer; IEEE Transactions on Geoscience Electronics, vol. GE-16, No. 2, Apr. 1978.

Risbo, Torben, et al., Ørsted pre-flight magnetometer calibration mission, Apr. 2003.

Stahl-Offergeld, M., et al., Integrated Sensitivity Adjustment for 30 Hall Sensors, Sensor Letters, vol. 7, 313-316, 2009.

* cited by examiner

APPARATUS AND METHOD FOR CALIBRATING A MAGNETIC SENSOR SYSTEM USING AN INHOMOGENEOUS MAGNETIC FIELD SOURCE

CROSS-REFERENCE TO RELATED APPLICATIONS

This application claims priority from German Patent Application No. 102021210552.1, which was filed on Sep. 22, 2021, and is incorporated herein in its entirety by reference.

The innovative concept described herein relates to a method for calibrating a magnetic sensor system with at least one magnetic field source and a magnetic field sensor arrangement with several individual magnetic field sensors. The method is characterized, among other things, by the fact that the calibration process can be performed with an inhomogeneous magnetic field source. The innovative concept described herein also relates to an apparatus for calibrating a magnetic sensor system.

BACKGROUND OF THE INVENTION

The method described herein can be used in particular for the calibration of so-called three-dimensional-measurement magnetic field sensors or 3D sensors. These are magnetic field sensors that can detect the magnetic field according to magnitude and direction in all three spatial directions.

This is to be distinguished from scalar-measurement sensors, such as conventional Hall sensors, which can only measure the magnitude of the magnetic field perpendicular to their chip plane. For example, a 3D sensor chip can have three such scalar-measurement sensor elements, wherein each sensor element can measure in a specific preferential direction. For this purpose, the three scalar-measurement sensor elements can be aligned within the 3D sensor chip such that each sensor element detects the magnetic field in a respective spatial direction (x-, y- and z-direction). Whereas conventional Hall sensors are sensitive only for one spatial direction each, and in particular to magnetic fields perpendicular (z-axis) to the chip surface, a 3D sensor additionally measures the magnetic fields aligned in parallel (x- and y-axis) to the chip surface. Thus, a single 3D sensor chip can detect all three spatial components of the magnetic field vector. This, a 3D sensor measures not only the magnitude of the magnetic field but also the direction of the magnetic field vector. The same can therefore also be referred to as a vector-measurement magnetic field sensor. By integrating several 3D sensors on one component, applications can be realized that are robust against magnetic interference fields.

For example, several 3D sensors can be used to measure all six spatial degrees of freedom (3x rotation about x-, y- and z-axis, 3x translation along x-, y- and z-axis).

Due to the technology, however, integrated magnetic field sensors of any kind show various measurement errors. On the one hand, there is a relatively large zero point error (offset), i.e. a signal without any magnetic field being present at all, and on the other hand, there are sensitivity errors, which have the effect that an identical magnetic field results in different measurement values for different sensors. In addition, with integrated Hall sensors, the sensitive axis of the sensor is often tilted against the ideal axis, resulting in undesirable sensitivity to orthogonal fields. This is particularly obvious with three-dimensional-measurement Hall sensors (3D sensors).

If, for example, Hall sensors are used in combination with a permanent magnet in a position measurement system, further error influences occur. The magnetization strength and direction of the magnet are also subject to large variations due to manufacturing. If the sensor is mounted on a PCB, mounting tolerances result in further errors in position detection.

According to the current state of the art, calibration of vector-measurement (3D) magnetic field sensors is performed by means of homogeneous magnetic fields, which are generated in different directions and in a defined sequence at the location of the sensor. The variation of the magnetic fields can be provided by coil systems, which generate an exactly adjustable field at the location of the sensor [4-7,14]. To achieve this, a homogeneous field is used, which is generated by means of a so-called Helmholtz coil arrangement with a total of six individual coils, which involves a high technical effort.

Another option for calibration is to cause a variation of the magnetic field at the location of the sensor by means of a movement of the sensor in the magnetic field, for example by means of a complete rotation around the measurement axes [1-3,8,9]. Measurement errors such as offset and sensitivity error can then be determined from the measurement values by means of analytical calculation or compensation calculation, which are applied as correction values to the measured value. However, only a few parameters can be determined with this method. In addition, it is a prerequisite that the device to be calibrated can move almost freely in space, which is why this method is used for mobile terminal devices, but not for applications in position sensor technology.

By means of the two methods mentioned, however, only the magnetic field sensors themselves can be calibrated, but not the additional inaccuracies caused in a magnetic sensor system by the magnet itself. A remedy is to measure the individual magnetic field of the magnet to determine its inaccuracies and account for them computationally in the finished system. The disadvantage of this method, however, is that each sensor and each magnet have to be calibrated independently and the correction data are to be uniquely assigned to the respective sensor-magnet pairing. This is associated with an enormously high expenditure of time and cost, which is why this method is hardly used in practice.

SUMMARY

According to an embodiment, a method for calibrating a magnetic sensor system including at least one magnetic field source and a magnetic field sensor arrangement with several individual magnetic field sensors may have the steps of: performing a plurality of individual measurements, wherein each individual measurement provides a number of measurement values depending on the number of the individual magnetic field sensors, wherein the magnetic field of the magnetic field source is varied at the location of the magnetic field sensor arrangement between two successive individual measurements, determining, based on the measurement values and by applying an optimization or estimation method, one or several unknown magnetic field sensor-specific parameters and/or one or several magnetic field sensor-specific parameters, each used as correction values of the magnetic sensor system by applying these correction values to future measurement results of the magnetic sensor system, characterized in that the method is performed with a magnetic field source generating an inhomogeneous magnetic field.

Another embodiment may have a non-transitory digital storage medium having a computer program stored thereon to perform the inventive method when said computer program is run by a computer.

Another embodiment may have an apparatus for calibrating a magnetic sensor system, wherein the magnetic sensor system includes at least one magnetic field source and one magnetic field sensor arrangement including several individual magnetic field sensors, wherein the magnetic sensor further includes a calibration apparatus configured to perform a plurality of individual measurements, wherein each individual measurement provides a number of measurement values depending on the number of the individual magnetic field sensors, wherein the magnetic field of the magnetic field source is varied at the location of the magnetic field sensor arrangement between two successive individual measurements, determine, based on the measurement values and by applying an optimization or estimation method, one or several unknown magnetic field sensor-specific parameters and/or one or several magnetic field sensor-specific parameters, wherein the determined parameters are used as correction values of the magnetic sensor system by applying the correction values to future measurement results of the magnetic sensor system, characterized in that the magnetic field source generates an inhomogeneous magnetic field.

The inventive method is used for calibrating a magnetic sensor system with at least one magnetic field source and a magnetic field sensor arrangement with several individual magnetic field sensors. For this purpose, a plurality of individual measurements is performed, each individual measurement providing a number of measurement values depending on the number of individual magnetic field sensors. During different individual measurements, i.e. between two individual measurements, the magnetic field of the magnetic field source at the location of the magnetic field sensor arrangement is varied. That is, during a first measurement, a first magnetic field prevails at the location of the magnetic field sensor arrangement, and during a second measurement, a second magnetic field different from the first magnetic field prevails at the location of the magnetic field sensor arrangement. Variation of the magnetic field means a change in magnitude and/or direction of the magnetic field, i.e., the magnitude and/or direction of the magnetic field can differ between two measurements at the location of the magnetic field sensor arrangement. Location of the magnetic field sensor arrangement means the magnetic field sensitive area of the magnetic field sensor arrangement, by means of which the magnetic field sensor arrangement measures the magnetic field (magnitude and/or direction). The inventive method further comprises a step of determining one or several unknown magnetic field sensor-specific parameters, i.e. parameters relating to the magnetic field sensors. Alternatively or additionally, the inventive method can optionally include a step of determining magnetic field source-specific parameters, i.e., parameters relating to the magnetic field source. Both the unknown magnetic field source-specific parameters and the unknown magnetic field sensor-specific parameters can be determined based on the previously determined measurement values and by using an optimization or estimation method. It can happen that one or several of the magnetic field source-specific parameters are known previously. In this case, these previously known magnetic field source-specific parameters do not have to be determined again. Instead, the known magnetic field source-specific parameters can be used for the further steps of the calibration. The determined or previously known magnetic field source-specific parameters and the determined magnetic field sensor-specific parameters can then be used as correction values for calibrating the magnetic sensor system by applying these correction values to future measurement results of the magnetic sensor system. The inventive method is characterized, among others, in that the same can be performed with a magnetic field source that generates an inhomogeneous magnetic field. In principle, most magnetic field sources generate an inhomogeneous magnetic field. That is, simple permanent magnets, for example, can be used for performing this method. Thus, there is no need to generate homogeneous magnetic fields by means of complex and expensive apparatus, such as Helmholtz coils and the like. With the inventive method, in the best case, external test equipment can be completely omitted, since the magnetic field sensor system can calibrate itself with its own on-board means, so to speak. The optimization or estimation procedure used in the invention to determine the calibration parameters or correction values can run on an already existing controller and can, for example, be integrated in an existing ASIC of the magnetic sensor system.

Further, the present invention relates to an apparatus for calibrating a magnetic sensor system, wherein the magnetic sensor system comprises at least one magnetic field source and a magnetic field sensor arrangement with several individual magnetic field sensors. The magnetic sensor system comprises a calibration apparatus. The same is designed to perform a plurality of individual measurements, each individual measurement providing a number of measurement values depending on the number of individual magnetic field sensors. According to the invention, the magnetic field of the magnetic field source at the location of the magnetic field sensor arrangement is varied during different individual measurements, i.e. between two individual measurements. The calibration apparatus is further configured to determine, based on the measurement values and by using an optimization or estimation method, one or several magnetic field source-specific parameters as well as one or several unknown magnetic field sensor-specific parameters, wherein the determined parameters are used as correction values for calibrating the magnetic sensor system by applying the correction values to future measurement results of the magnetic sensor system. According to the invention, the apparatus is also characterized in that the magnetic field source generates an inhomogeneous magnetic field.

BRIEF DESCRIPTION OF THE DRAWINGS

Embodiments of the present invention will be detailed subsequently referring to the appended drawings, in which.

DETAILED DESCRIPTION OF THE INVENTION

In the following, embodiments are described in more detail with reference to the figures, wherein elements having the same or similar functions are provided with the same reference numbers.

Method steps illustrated or described within the scope of the present disclosure can also be carried out in an order different to the one illustrated or described. Further, method steps relating to a specific feature of an apparatus are interchangeable with the same feature of the apparatus, which also applies vice versa.

The invention will first be described objectively based on the inventive apparatus for calibrating a magnetic sensor system. This is followed by a description of the individual method steps of the inventive method for calibrating the magnetic sensor system.

Figure 1:
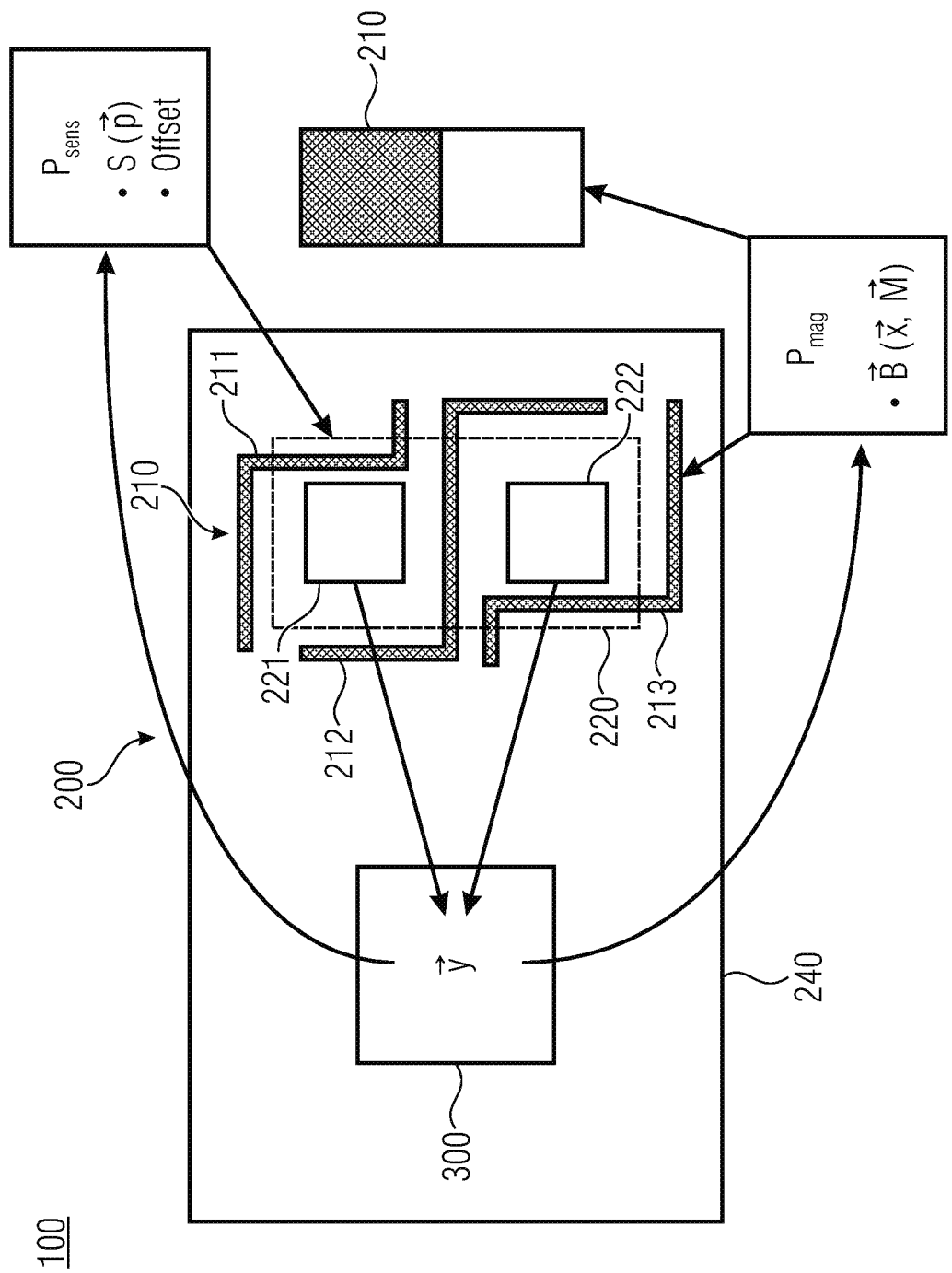
FIG. 1 is a schematic top view of an inventive apparatus for calibrating a magnetic sensor system according to an embodiment.

FIG. 1 shows a schematic representation of an inventive apparatus 100 for calibrating a magnetic sensor system 200. The magnetic sensor system 200 comprises at least one magnetic field source 210 and a magnetic field sensor arrangement 220 comprising several individual magnetic field sensors 221, 222.

The magnetic field sensor arrangement 220 or the respective magnetic field sensors 221, 222 can be arranged on a substrate 240, such as a component carrier (PCB: Printed Circuit Board). Here, the individual magnetic field sensors 221, 222 can be arranged adjacent to each other and in close proximity to each other.

The magnetic field source 210, on the other hand, can be configured separately from the substrate 240, i.e., the magnetic field source 210 may not be connected to the substrate 240 so that the magnetic field source 210 is movable relative to the substrate 240 or the magnetic field sensor arrangement 220. This would be possible, for example, if the magnetic field source 210 is a separate permanent magnet. In this case, the magnetic field can be varied (in magnitude and/or direction) at the location of the magnetic field sensor arrangement 220 by moving the magnetic field source 210 relative to the magnetic field sensor arrangement 220.

Alternatively or additionally, it would be possible that the magnetic field source 210 is configured as an electromagnetic source. For example, the magnetic field source 210 can be configured in the form of an excitation conductor arrangement. This excitation conductor arrangement 210 can comprise one or several excitation conductors 211, 212, 213 which are appropriately energized and thereby generate an electromagnetic field. The magnetic field source 210 can be arranged on the substrate 240 in that, for example, the individual excitation conductors 211, 212, 213 are configured in the form of conductive traces on the substrate 240 (e.g., PCB). In this case, the magnetic field source 210 would be immobile relative to the magnetic field sensor arrangement 220. However, the magnetic field of the magnetic field source 210 could then be varied at the location of the magnetic field sensor arrangement 220 by controlling the excitation conductors 211, 212, 213 differently, thereby producing different electromagnetic fields (in magnitude and/or direction).

The magnetic sensor system 200 comprises a calibration apparatus 300. The calibration apparatus 300 can also be arranged on the substrate 240. The calibration apparatus 300 can, for example, run on an existing controller and can be integrated, for example, in an existing ASIC of the magnetic sensor system 200.

The calibration apparatus 300 is configured to perform a plurality of individual measurements with the magnetic sensor system 200. Each individual measurement provides a specific number of $n_y$ of measurement values, which in turn depends on the number of individual magnetic field sensors 221, 222 present. The determined measurement values can be represented in the form of a measurement vector $\vec{y}$. The measurement vector $\vec{y}$ can contain not only the number $n_y$ of the individual measurement values but also the number $n_{mess}$ of performed measurements (dim $(\vec{y})=n_y*n_{mess}$). Corresponding examples are explained in more detail below.

In the different individual measurements, i.e., between each two successive individual measurements, the magnetic field of the magnetic field source 210 at the location of the magnetic field sensor arrangement 220 is varied or changed. Varied or different magnetic fields are also referred to as different magnetic field configurations within the present disclosure.

The magnetic field can be varied such that a different magnetic field prevails at the location of the magnetic field sensor arrangement 220 during each individual measurement. That is, during the plurality of individual measurements performed, a different magnetic field configuration can be generated at the location of the magnetic field sensor arrangement 220 for each individual measurement, so that one and the same magnetic field configuration does not occur multiple times during the respective individual measurements.

As briefly mentioned above, a variation of the magnetic field at the location of the magnetic field sensor arrangement 220 can be effected, for example, by moving the magnetic field source 210 relative to the magnetic field sensor arrangement 220. For this, for example, the position and/or the spatial orientation of the magnetic field source 210 relative to the magnetic field sensor arrangement 220 can be changed. However, it is also possible that the magnetic field is generated electromagnetically and is changed by different wiring. Further, it would also be possible to change the magnetization of the magnetic field source 210, for example by varying the temperature. Corresponding embodiments will be described in more detail below.

The calibration apparatus 300 is further configured to determine one or several magnetic field source-specific parameters $P_{mag}$ and one or several unknown magnetic field sensor-specific parameters $P_{sens}$ based on the measurement values determined during the individual measurements and using an optimization or estimation method.

The magnetic field sensor-specific parameters $P_{sens}$ to be determined can include, for example:
 an offset (zero point error), and/or
 the sensitivity (volts per tesla) of each individual magnetic field sensor 221, 222, expressed by a sensitivity matrix $S(\vec{p})$ (see below), and/or
 the position and/or spatial orientation of the magnetic field sensor array 220 or the individual magnetic field sensors 221, 222 on the substrate 240 (e.g., PCB) on which the same are arranged.

Magnetic field source-specific parameters $P_{mag}$ to be determined can include, for example:

the specific magnetization of the magnetic field source 210 in the three spatial directions (Mx, My, Mz), expressed by the magnetization vector $\vec{M}$, and/or the temperature of the magnetic field source 210 as a scalar parameter, the position and/or spatial orientation of the magnetic field source 210 relative to the magnetic field sensor arrangement 220, expressed by the position vector $\vec{x}$, and/or quantities derived from the position and/or spatial orientation, such as the velocity and/or acceleration of the magnetic field source 210 with respect to the magnetic field sensor arrangement 220.

One object of the present invention is to define or calibrate the above-mentioned magnetic field source-specific parameters $P_{mag}$ in order to obtain a corrected measurement of the magnetic flux density $\vec{B}$ of the magnetic field source 210. The magnetic flux density $\vec{B}$ is described in dependence on its position and/or spatial orientation and the magnetization vector, expressed by the flux density vector $\vec{B}(\vec{x}, \vec{M})$. That is, the magnetic flux density $\vec{B}$ is illustrated in dependence on the two magnetic field source-specific parameters position and/or spatial orientation $\vec{x}$ as well as specific magnetization $\vec{M}$ So, as long as at least these two parameters $\vec{x}$ and $\vec{M}$ have been defined or calibrated, a corrected measured value of the magnetic flux density $\vec{B}$ of the magnetic field source 210 can be determined.

One or several of the magnetic field sensor-specific parameters $P_{sens}$ to be determined can be unknown in advance. The same applies to the magnetic field source-specific parameters $P_{mag}$. However, it is also possible that one or several of the magnetic field source-specific parameters $P_{mag}$ are known in advance. In this respect, too, corresponding embodiments are described in more detail below.

The parameters unknown in advance and determined during the individual measurements, i.e., the magnetic field sensor-specific parameters $P_{sens}$ and/or the magnetic field source-specific parameters $P_{mag}$, are used as correction values for calibrating the magnetic sensor system 200 by applying these correction values to future measurement results of the magnetic sensor system 200, which corresponds to a calibration of the magnetic sensor system 200 with the determined data or parameters $P_{mag}$, $P_{sens}$.

In this regard, the present invention is characterized in that the magnetic field source 210 generates an inhomogeneous magnetic field. In general, all magnetic field sources initially provide an inhomogeneous field. Accordingly, the same is very easy to generate. As a result, the magnetic sensor system 200 can be calibrated with very little effort, for example, by simply providing a small permanent magnet or a coil arrangement that can be easily realized.

Figure 2:
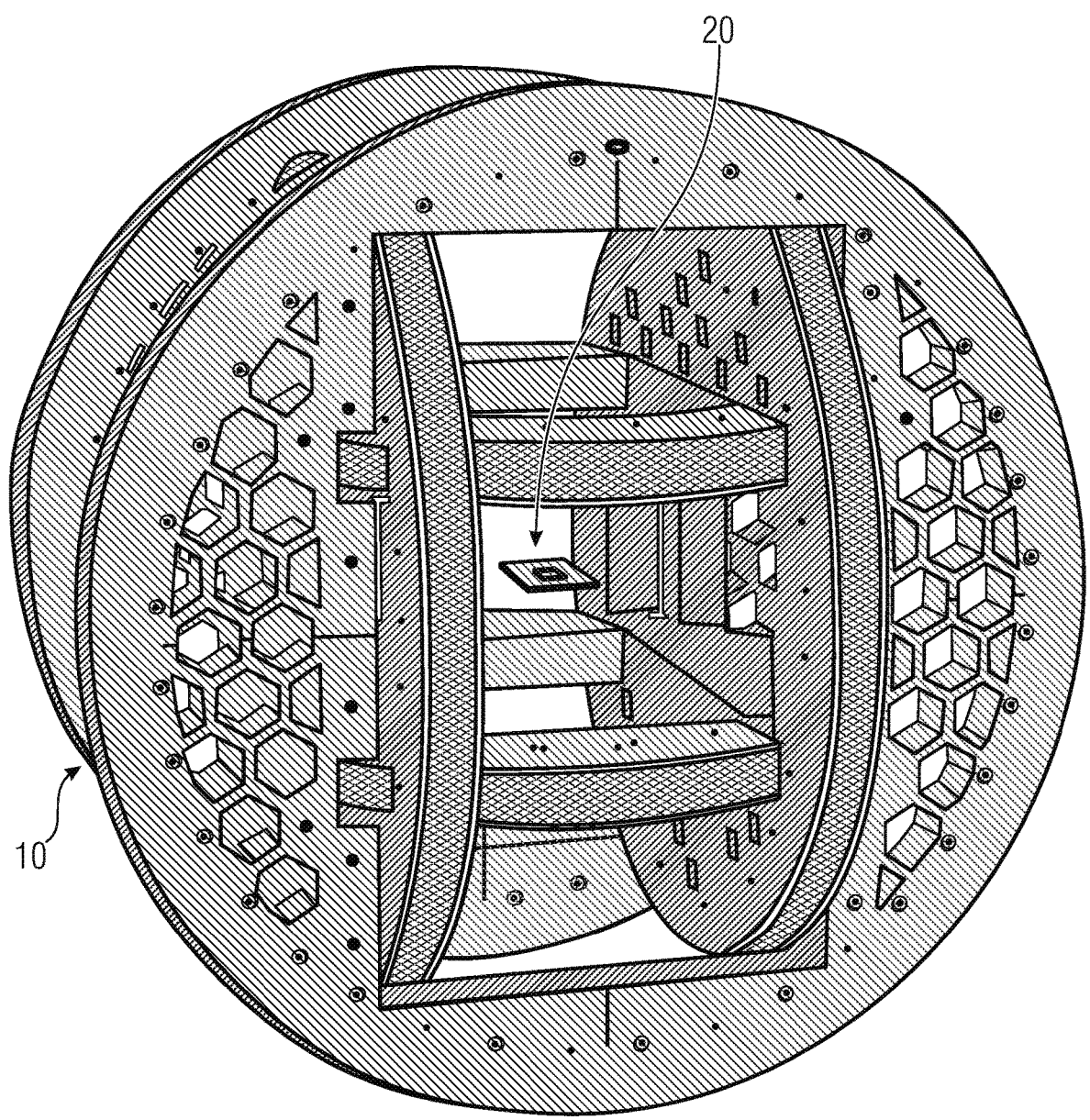
FIG. 2 is a perspective view of a calibration apparatus with Helmholtz coils according to conventional technology.

In comparison, FIG. 2 shows merely exemplarily an apparatus as it is used in conventional technology for the calibration of magnetic sensor systems. This is a Helmholtz coil arrangement 10, which is shown in direct size comparison with a component carrier 20, on which the magnetic field sensors are arranged. The Helmholtz coil arrangement 10 generates homogeneous magnetic fields that act in different directions and in a defined order at the location of the magnetic field sensors. The variation of the magnetic fields can take place with the help of the respective Helmholtz coils, each of which generates a precisely adjustable field at the location of the magnetic field sensor. So far, homogeneous fields have thus been used in conventional technology to calibrate a magnetic sensor system. This homogeneous magnetic field is generated by means of a Helmholtz coil arrangement 10 with a total of six individual coils, which involves a great deal of technical effort.

In contrast, according to the invention, an inhomogeneous magnetic field is used for calibrating a magnetic sensor system 200. As was mentioned at the beginning, a small permanent magnet is sufficient for this purpose, so that the effort needed for calibration can be significantly minimized, which of course is also reflected in significantly reduced production costs. Above that, the inventive apparatus can be used in situ, i.e. at the place of use (e.g. vehicle) of the magnetic sensor system 200, as well as during operation of the magnetic sensor system 200 for calibration of the same. Again, this is obviously not possible with a large Helmholtz coil arrangement as has been used to date.

Figure 3:
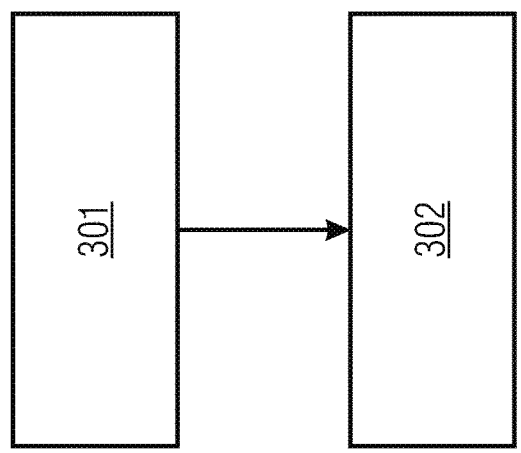
FIG. 3 is a schematic block diagram for illustrating the inventive method according to an embodiment.

For the sake of completeness, FIG. 3 shows a block diagram illustrating the inventive method.

In block 301, a plurality of $n_{mess}$ of individual measurements are performed, each individual measurement providing a number $n_y$ of measurement values depending on the number of individual magnetic field sensors 221, 222, wherein the magnetic field of the magnetic field source 210 is varied between two successive individual measurements, so that for different individual measurements, the magnetic field of the magnetic field source 210 at the location of the magnetic field sensor arrangement 220 is different in each case.

In block 302, one or several unknown magnetic field sensor-specific parameters $P_{sens}$ and optionally additionally one or several magnetic field source-specific parameters $P_{mag}$ are determined, based on the measurement values of the magnetic field sensors 221, 222 and using an optimization or estimation method. These determined parameters $P_{sens}$, $P_{mag}$ are then respectively used as correction values for calibrating the magnetic sensor system 200 by applying these correction values to future measurement results of the magnetic sensor system 200.

The inventive method is also characterized, among other things, by the fact that the same is performed with a magnetic field source 210 that generates an inhomogeneous magnetic field.

Figure 4B:
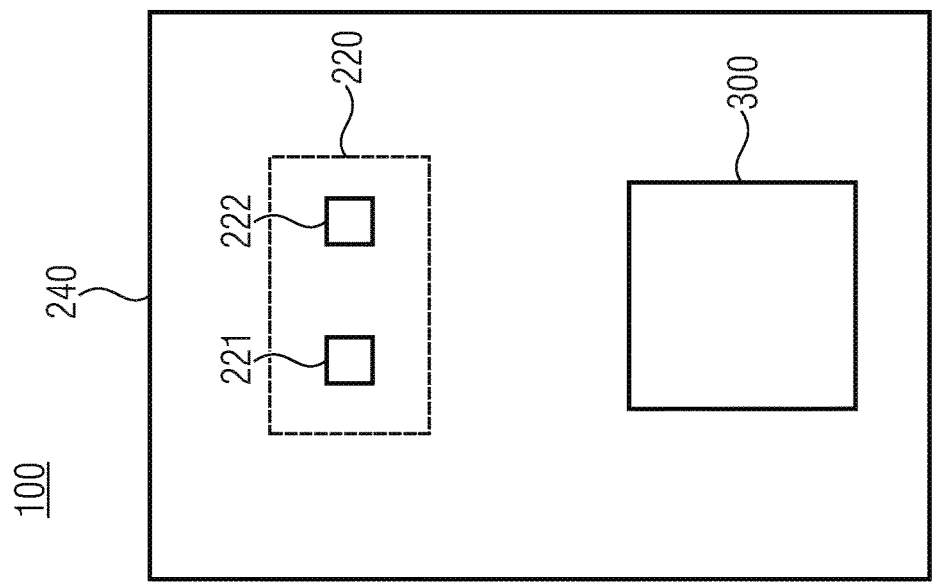
FIG. 4B is a schematic top view of an inventive apparatus having a magnetic field sensor arrangement with two vector-measurement magnetic field sensors according to an embodiment.
Figure 4A:
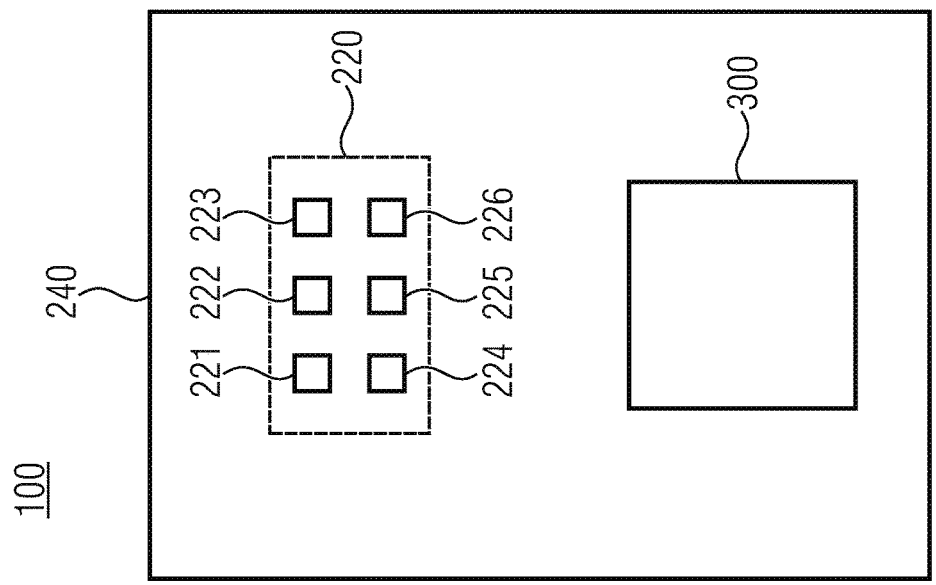
FIG. 4A is a schematic top view of an inventive apparatus having a magnetic field sensor arrangement with six scalar-measurement magnetic field sensors according to an embodiment.

The method is particularly suitable for calibrating magnetic field sensor arrangements which can determine the magnetic field in vectors, i.e. according to magnitude and direction. For this purpose, the magnetic field sensor arrangement 220 can have at least six scalar-measurement magnetic field sensors 221, ..., 226 according to a possible embodiment (FIG. 4A), each magnetic field sensor 221, ..., 226 having exactly one preferential direction sensitivity along which the respective magnetic field sensor 221, ..., 226 is sensitive to a magnetic field, so that a scalar-measurement magnetic field sensor 221, ..., 226 can measure the magnetic field in exactly one spatial direction.

These can be individual Hall sensors, for example, each of which is sensitive to the magnetic field perpendicular to the chip plane. In this direction, the same thus exhibit a preferential direction sensitivity. The at least six scalar-measurement magnetic field sensors 221, ..., 226 (e.g. Hall sensors) can be arranged in a respective 90° spatial configuration in each case, so that they can measure the magnetic field in different spatial directions, depending on their respective chip orientation. A single scalar-measurement magnetic field sensor measures only the magnitude of the magnetic field, depending on the relative spatial configuration or the respective chip orientation (90° offset to each other). With at least three or six scalar-measurement magnetic field sensors 221, ..., 226, which are arranged in the above-mentioned 90° spatial configuration relative to one another, the direction of the magnetic field can also be determined, i.e. the magnetic vector field can thus be determined according to magnitude and direction.

According to an alternative embodiment (FIG. 4B), the magnetic field sensor arrangement 220 can comprise at least two vector-measurement 3D magnetic field sensors 221, 222, wherein each 3D magnetic field sensor 221, 222 comprises exactly three preferential direction sensitivities along which the respective magnetic field sensor 221, 222 is sensitive to a magnetic field. That is, a 3D magnetic field sensor 221, 222 can measure the magnetic field in all three spatial directions.

In contrast to a single scalar-measurement magnetic field sensor, a 3D magnetic field sensor can determine both the magnitude and the direction of the magnetic field. In this case, two of these 3D magnetic field sensors are sufficient. A single 3D magnetic field sensor can contain three individual scalar-measurement magnetic field sensors, which in turn are arranged in a corresponding 90° spatial configuration relative to each other in order to be able to measure in all three spatial directions (magnetic field in x, y and z direction).

Figure 5:
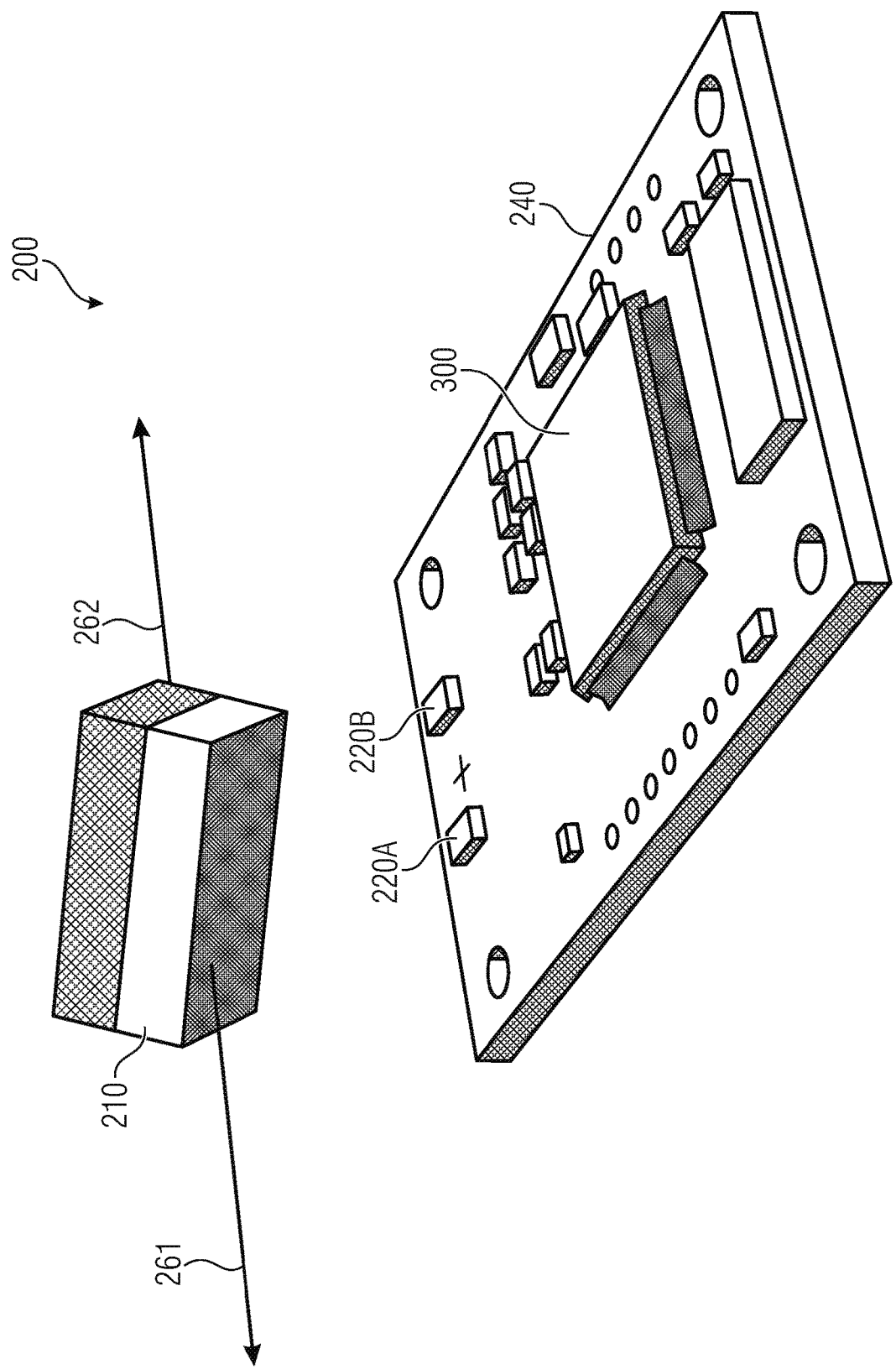
FIG. 5 is a schematic top view of an inventive apparatus according to a first embodiment, wherein the inhomogeneous magnetic field is varied between two successive individual measurements by changing the position and/or the orientation of the magnetic field source relative to the magnetic field sensor arrangement.
Figure 6:
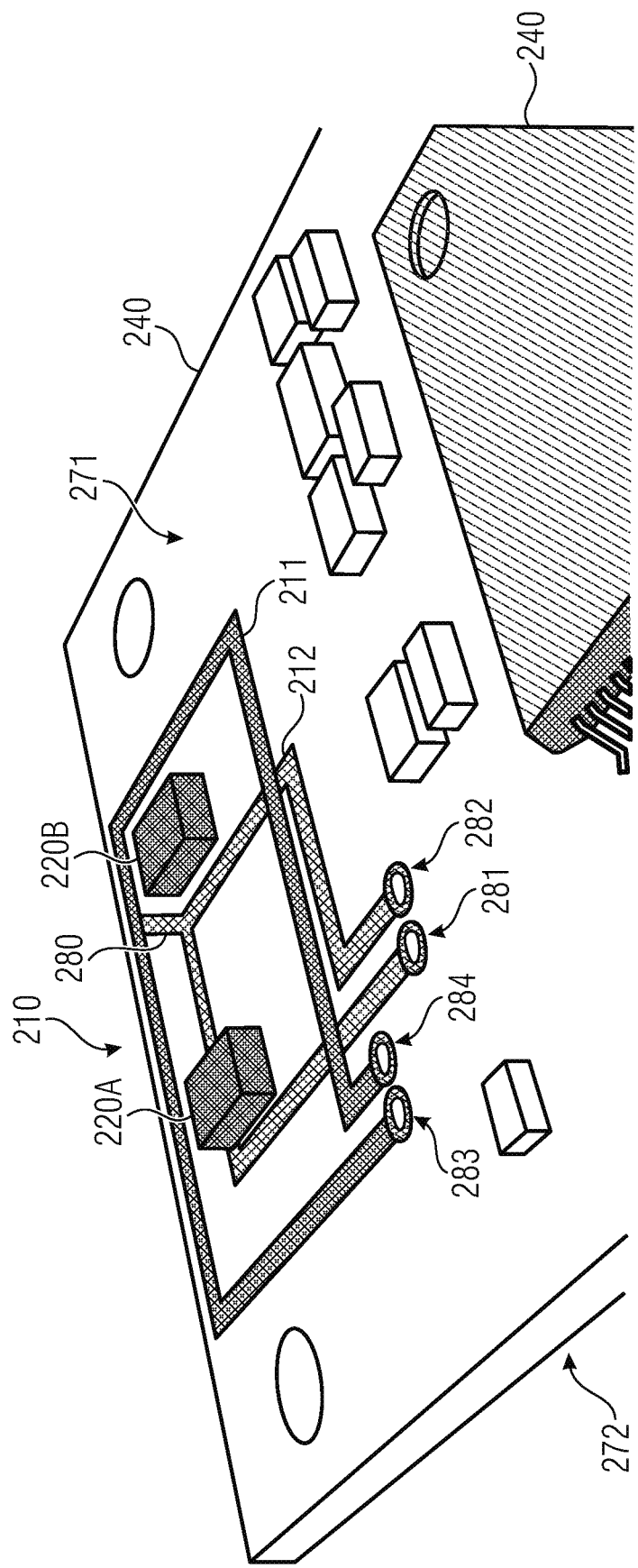
FIG. 6 is a schematic top view of an inventive apparatus according to a second embodiment, wherein the inhomogeneous magnetic field is varied between two successive individual measurements by connecting contact terminals of excitation conductors in different combinations in pairs.

In the following, possible embodiments of the inventive method are described in more detail, wherein first one example is explained in which the magnetic field is varied by moving the magnetic field source 210 relative to the magnetic field sensor arrangement 220 (FIG. 5). Subsequently, another example is described in which the magnetic field is varied in that the magnetic field source 210 comprises excitation conductors 221, 222 which are connected differently (FIG. 6). Of course, the following explanations apply to both variants.

However, common to all embodiments described herein is the use of a magnetic field source that generates an inhomogeneous magnetic field, and varying (e.g., moving or changing) the magnetic field source at the location of the magnetic field sensor arrangement 220.

In order to perform the inventive method, it is, in principle, advantageous if the geometric shape of the magnetic field source 210 is known in advance except for a few parameters. In particular, it is advantageous if the external shape of the magnetic field source 210 is known. In the case of a permanent magnet, for example, it can be known whether the magnet is cuboidal or cylindrical. The exact dimensions of the magnetic field source 210, such as the edge length or the radius, can be unknown parameters, as well as the specific magnetization of the magnetic field source 210. This is an advantage especially for the magnetization, because the same is subject to strong manufacturing tolerances and usually does not point exactly in the desired direction (skew magnetization).

According to embodiments of the invention, therefore, of the magnetic field source-specific parameters $P_{mag}$, for example, at least the dimensions of the magnetic field source (210), and/or the magnetization vector ($\vec{M}$) of the magnetic field source (210)

can be unknown before the individual measurements are performed, which would mean that the corresponding degrees of freedom of the respective unknown magnetic field source-specific parameters $P_{mag}$ are variable (the variable and constant degrees of freedom are described in more detail below).

Provided that at least the external geometric shape (cuboid, cylinder, etc.) of the magnetic field source 210 is known, the expected magnetic field can be determined mathematically. Additionally, a mathematical model of the expected errors/non-idealities, i.e. the individual offsets, sensitivities and positions or orientations of the respective magnetic field sensors 221, 222, can be created.

Now the individual measurements can be performed, wherein the magnetic field of the magnetic field source 210 is varied between two successive individual measurements. Several measurement values are determined per individual measurement, depending on the number of magnetic field sensors 221, 222. Insofar as the magnetic field is varied by positioning the magnetic field source 210 at different points in space between two individual measurements, the respective measurement values of the individual magnetic field sensors 221, 222 are recorded and stored accordingly at different points of the parameter space.

When a sufficiently large number of individual measurements have been performed and a sufficient number of measurement points have been determined, an optimization or estimation algorithm can be started, which determines both the magnetic field source-specific parameters $P_{mag}$ of the magnetic field source 210 and the magnetic field sensor-specific parameters $P_{sens}$ of the magnetic field sensor arrangement 220. Both the unknown parameters of the models of the magnetic field and the modeled errors or non-idealities of the magnetic field sensors 221, 222 can be constant but also variable during the execution of the individual measurements.

The minimum number of individual measurements measurement points to be performed results from the limiting case of a linear equation system having only independent equations with a specific number of constants $n_{konst}$ and variables $n_{var}$. On the basis of a plurality $n_{mess}$ of individual measurements, the magnetic field sensor-specific parameters $P_{sens}$ and/or the magnetic field source-specific parameters $P_{mag}$ can be determined.

If certain conditions or minimum requirements for the number of individual measurements as well as for the variation of the magnetic field are met, the resulting non-linear system of equations can be solved unambiguously within a limited range. This non-linear system of equations includes one or several constants and variables corresponding to the above-mentioned known and/or unknown magnetic field sensor-specific parameters $P_{sens}$ and magnetic field source-specific parameters $P_{mag}$. In order to determine the magnetic field sensor-specific parameters $P_{sens}$ as well as the magnetic field source-specific parameters $P_{mag}$, the non-linear system of equations can be solved, for example by means of the aforementioned optimization or estimation algorithm.

The solvability of the non-linear system of equations, i.e., the observability of the system, is given, provided that a sufficient number $n_y$ of measurement values of the individual magnetic field sensors 221, 222 per individual measurement as well as a sufficient number of individual measurements $n_{mess}$ at different positions (for variation of the magnetic field) are available. Here the following has to apply $$n_{mess} * n_{var} + n_{konst} << n_y * n_{mess}. \tag{1}$$

If, for example, four 3D magnetic field sensors are used, a total of $n_y=4*3=12$ measurement values are obtained per individual measurement, because each individual 3D magnetic field sensor provides three measurement values per individual measurement. If a total of $n_{mess}=6$ individual measurements are performed, a total of $6*12=42$ measurement values is obtained.

With reference to the above inequality (1), it can thus be stated that both the magnetic field source-specific parameters $P_{mag}$ and the magnetic field sensor-specific parameters $P_{sens}$ each can comprise a specific number $n_{var}$ of variable degrees of freedom and a specific number $n_{konst}$ of constant degrees of freedom.

Accordingly, embodiments of the invention provide that a minimum number of individual measurements are performed, wherein this minimum number of individual measurements to be performed depends on the number $n_y$ of measurement values determined by means of the magnetic field sensors 221, 222, and the number $n_{var}$ of the variable degrees of freedom of the magnetic field source-specific parameters $P_{mag}$ and the magnetic field sensor-specific parameters $P_{sens}$, and the number $n_{konst}$ of the constant degrees of freedom of the magnetic field source-specific parameters $P_{mag}$ and the magnetic field sensor-specific parameters $P_{sens}$.

If the unknown parameters $P_{sens}$ and $P_{mag}$ are defined, and if it is known how many magnetic field sensors 221, 222 are used, the inequality (1) can also be used to determine the number of individual measurements needed.

In addition to this above-mentioned minimum requirement, the observability of the system is crucial. This is improved by varying the magnetic field as much as possible, for example by distributing the measurement points (position and/or orientation of the magnetic field source 210 relative to the magnetic field sensor arrangement 220) as much as possible, and/or by keeping as many parameters $P_{sens}$, $P_{mag}$ constant as possible for each individual measurement. This is given for some parameters such as the sensitivity matrix per se, but can also be achieved, for example, by allowing the magnetic field source 210 to move in only a few degrees of freedom due to the way the same is mounted. Such an example will be explained in more detail below with reference to FIG. 5.

FIG. 5 first shows an inventive apparatus 100 for calibrating a magnetic sensor system 200. The magnetic sensor system 200 comprises a component carrier or substrate 240 in the form of a printed circuit board (PCB). Two magnetic field sensor arrangements 220A, 220B are mounted on the substrate 240, each magnetic field sensor arrangement 220A, 220B comprising two 3D magnetic field sensors. The magnetic field sensor assemblies 220A, 220B each comprise a housing, which is why the individual 3D magnetic field sensors accommodated therein are not visible in FIG. 5.

Thus, the embodiment shown herein comprises a first magnetic field sensor arrangement 220A with two individual (not shown) 3D magnetic field sensors each, and a second magnetic field sensor arrangement 220B with two individual (not shown) 3D magnetic field sensors each as well. This embodiment thus has a total of four 3D magnetic field sensors.

The magnetic sensor system 200 also includes a calibration apparatus 300, also mounted on the substrate 240. This can be, for example, an ASIC (ASIC: Application Specific Integrated Circuit) mounted on the PCB 240. The calibration apparatus 300 controls the flow of measurements and is used for signal processing.

The magnetic sensor system 200 further comprises a magnetic field source 210. In this case, merely exemplarily, this is a cuboid-shaped permanent magnet. In this example, the magnetic field source 210 is not aligned parallel to the substrate 240 (e.g. PCB), but is inclined in two axes by 45° each. This ensures that, as far as possible, all components of the 3D magnetic field sensors within the magnetic field sensor arrays 220A, 220B are adjusted. This can improve the quality of the evaluation.

The magnetic field source 210 is also movable relative to the magnetic field sensor arrangements 220A, 220B. For example, the magnetic field source 210 can be translationally displaced along at least one of its three translational axes (x-, y-, z-axis). Alternatively or additionally, the magnetic field source 210 can be rotated about at least one of its three rotational axes (x-, y-, z-axis).

In the example shown herein, the magnetic field source 210 is clamped or fixed in such a way that the same can only move back and forth along exactly one translational axis (indicated by the arrows 261, 262). Thus, along this path, the permanent magnet 210 is moved, between two individual measurements, relative to the printed circuit board 240 or the magnetic field sensor arrangements 220A, 220B arranged thereon, in order to thereby vary the magnetic field between the respective individual measurements.

In this non-limiting example, during the movement of the magnetic field source 210, a number of $n_{mess}=6$ individual measurements are made. For example, an individual measurement can be performed at each of six different positions of the magnetic field source 210 (relative to the magnetic field sensor arrangement 220). Each individual measurement generates a number of measurement values that depends on the number of magnetic field sensors that are used.

As mentioned above, two magnetic field sensor arrangements 220A, 220B are present in this example, wherein each magnetic field sensor arrangement 220A, 220B comprises two 3D magnetic field sensors each, and wherein each 3D magnetic field sensor provides three measurement values per individual measurement. Thus, with this arrangement, a total number of $n_y=2*2*3=12$ measurement values (2 magnetic field sensor arrangements 220A, 220B*2 3D sensors*3 measurement values per 3D sensor) are obtained per individual measurement.

As was also mentioned above, a total of six individual measurements are performed in this example, i.e. $n_{mess}=6$. Thus, a measurement vector $\vec{y}$ of the size $\dim(\vec{y})=n_y*n_{mess}=2*2*3*6=72$ can be formed (2 magnetic field sensor arrangements 220A, 220B*2 3D sensors*3 measurement values per 3D sensor*6 individual measurements). Together with the model $\vec{B}(\vec{x},\vec{M})$ of the magnetic field source 210 as well as a sensitivity matrix $S(\vec{p})$ for the individual sensitivities of each magnetic field sensor, and the additional assumption that there is no zero point error (offset), the measurements can be described as follows:

$$S(\vec{p}) \cdot \vec{B}(\vec{x},\vec{M}) = \vec{y} \qquad (2)$$

This means that equation (2) can be used to determine, on the basis of the measurement vector $\vec{y}$, the magnetic sensor-specific parameters $P_{sens}$ and the magnetic source-specific parameters $P_{mag}$. Here, the sensitivity matrix $S(\vec{p})$ is a magnetic sensor-specific parameter $P_{sens}$, and the model of the magnetic flux density $\vec{B}(\vec{x},\vec{M})$ includes magnetic source-specific parameters $P_{mag}$.

The sensitivity matrix $S(\vec{p})$ expresses the respective individual sensitivities of the individual (3D) magnetic field sensors 221, 222. The sensitivity matrix $S(\vec{p})$ is a rotation and scaling matrix which ensures that the x magnetic field sensor also only measures the x component Bx of the magnetic field, the y sensor accordingly only measures By and the z sensor only measures Bz. In addition, the sensitivity matrix $S(\vec{p})$ ensures that each component also provides the same output signal for identical magnetic excitation.

As discussed above with reference to FIG. 4B, each 3D magnetic field sensor comprises exactly three preferential direction sensitivities along which the respective 3D magnetic field sensor is sensitive to a magnetic field, so that each 3D magnetic field sensor can measure the magnetic field in all three spatial directions. This is because a 3D magnetic field sensor can comprise three scalar-measurement sensor elements that can be located at exactly the same location within the respective 3D magnetic field sensor. In turn, these individual scalar-measurement sensor elements can each comprise exactly one preferential direction sensitivity (x, y, and z directions). However, additionally, each of these three individual scalar-measurement sensor elements (e.g., with a preferential direction sensitivity in the z-direction) also measures a certain portion of the other two sensor elements (e.g., in the x- and y-directions). The latter portion is also referred to as cross-sensitivity. Thus, for each 3D magnetic field sensor, the sensitivity matrix $S(\vec{p})$ comprises 3*3=9 elements for the sensitivity.

The sensitivity matrix $S(\vec{p})$, in our example with four vector-measurement 3D magnetic field sensors, includes 4*3*3=36 unknown constants. The matrix elements are unknown because the individual sensor sensitivities are unknown. These are constants, i.e. constant degrees of freedom, since the sensitivities of a sensor essentially do not change, at least in the period during a calibration procedure.

Thus, by means of equation (2), one or several unknown magnetic field sensor-specific parameters $P_{sens}$ can be determined. These include, among others, the sensor sensitivities just described, namely the individual preferential direction sensitivity (e.g. in z-direction) of a respective magnetic field sensor, but additionally also an individual cross-sensitivity of a respective magnetic field sensor to magnetic fields that do not correspond to the preferential direction sensitivity (i.e. e.g. in x- and y-direction). The cross-sensitivities can therefore be magnetic field components which are orthogonal to the preferential direction sensitivity (cf. x-, y- and z-components).

The method described herein can also be used to determine an offset as another magnetic field sensor-specific parameter $P_{sens}$ Alternatively or additionally, the inventive method can be used to determine the position and/or the orientation of the individual magnetic field sensors with respect to the substrate 240 or component carrier on which the same are mounted, as a magnetic field sensor-specific parameter $P_{sens}$.

In summary, therefore, the unknown magnetic field sensor-specific parameters $P_{sens}$ to be determined by means of the inventive method can include at least one parameter from the following group:
  a zero point error (offset)
  an individual preferential direction sensitivity of an individual magnetic field sensor 221, 222
  an individual cross-sensitivity of an individual magnetic field sensor 221, 222 to magnetic fields that do not correspond to the preferential direction sensitivity of the respective magnetic field sensor 221, 222
  the position and orientation of the individual magnetic field sensors 221, 222 with respect to the component carrier 240 on which the same are mounted.

In the above example according to equation (2), in addition to the magnetic field sensor-specific parameters $P_{sens}$, magnetic field source-specific parameters $P_{mag}$ can also be determined. As an example for this, the model of the magnetic flux density of the magnetic field source $\vec{B}(\vec{x}, \vec{M})$ of the magnetic field source 210 is stated. The magnetic flux density $\vec{B}$ is stated here in dependence on the position and/or orientation (vector $\vec{x}$) of the magnetic field source 210 relative to the magnetic field sensor arrangement 220A, 220B and in dependence on the individual magnetization vector $\vec{M}$.

As a reminder: In this non-limiting example according to FIG. 5, the magnetic field source 210 was fixed or clamped in such a way that the same could only move along exactly one translation axis, e.g. along the x-axis (see FIG. 5, reference numbers 261, 262). That is, only one degree of freedom (translation in the x-direction) is variable. The other five degrees of freedom (translation along y- and z-axis as well as rotation around x-, y- and z-axis) were not variable, i.e. constant, due to the fixation of the magnetic field source 210. In equation (2) the vector describes $\vec{x}$ describes the unknown position of the magnetic field source 210 and thus consists of five constants and one variable in this non-limiting example.

The magnetization vector $\vec{M}$ describes the magnetization of the magnetic field source 210 and comprises components in the x-, y- and z-direction, i.e. $\vec{M}x$, $\vec{M}y$ and $\vec{M}z$. The magnetization vector $\vec{M}$ thus describes how strong and in which direction the magnetic field source 210 is magnetized. The magnetization of the magnetic field source 210 is generally unknown, but constant. That is, the magnetization vector M is unknown and is incorporated in the system of equations into equation (2) with further three constants ($\vec{M}x$, $\vec{M}y$ and $\vec{M}z$).

$\vec{B}(\vec{x},\vec{M})$ is a non-linear function and can be determined analytically for the, in the present example cuboidal, magnetic field source 210 [12]. The condition from equation (1) is therefore fulfilled with 6*1+5+36+3<<72 ($n_{mess}$=6 individual measurements*$n_{var}$=1 variable+$n_{konst1}$=5 constants of the position (2x translation) and orientation (3x rotation)+ $n_{konst2}$=36 constant matrix elements of the sensitivity matrix $S(\vec{p})$+$n_{konst3}$=3 constant components $\vec{M}x$, $\vec{M}y$ and $\vec{M}z$ of the magnetization vector $\vec{M}$).

All these parameters are magnetic field source-specific parameters $P_{mag}$, which can be determined by means of the inventive method. As a further possible magnetic field source-specific parameter $P_{mag}$, the dimensions of the magnetic field source 210 could also be determined.

In summary, therefore, the magnetic field source-specific parameters $P_{mag}$ that can be determined by means of the inventive method can include at least one parameter from the following group:
  a position of the magnetic field source 210 relative to the magnetic field sensor arrangement 220, i.e., translation along x-, y-, and z-direction an orientation of the magnetic field source 210 relative to the magnetic field sensor arrangement 220, i.e., rotation about x-, y-, and z-axis the specific magnetization vector $\vec{M}$ of the magnetic field source, i.e. the specific magnetization of the magnetic field source in all three spatial directions $\vec{M}x$, $\vec{M}y$, $\vec{M}z$ the dimensions of the magnetic field source 210.

The non-linear system of equations with the parameters $\vec{x}$, $\vec{M}$ and $\vec{p}$ can now be solved with a suitable non-linear optimization or estimation method, for example an Unscented Kalman filter [13]. This algorithm can be executed by the calibration apparatus 300. To generate suitable initial values for the algorithm, excitation conductors integrated in the magnetic field sensor arrangements 220A, 220B can be used. They can be used to generate a defined field at the location of the magnetic field sensors 221, 222, which can provide a value for the sensitivities that is already accurate to about 10 percent [10]. Further, a localization (location and position) of the magnetic field source 210 with ideal parameters from the sensor or magnet specification can serve as a starting value for the estimation.

According to a corresponding embodiment, the inventive method includes the following steps:

setting up a non-linear system of equations $$S(\vec{p}) \cdot \vec{B}(\vec{x}, \vec{M}) = \vec{y}$$

including:

a measurement vector $\vec{y}$ that includes the measurement values determined by means of the magnetic field sensors 221, 222 during the individual measurements, a mathematical model for describing the inhomogeneous magnetic field $\vec{B}(\vec{x}, \vec{M})$ of the magnetic field source 210 as a magnetic field source-specific parameter $P_{mag}$ to be determined, each of which has a certain number of variable degrees of freedom $n_{var}$ and/or constant degrees of freedom $n_{konst}$, and a mathematical model $S(\vec{p})$ for describing the individual sensitivities of the individual magnetic field sensors 221, 222 of the magnetic field sensor arrangements 220A, 220B as an unknown magnetic field sensor-specific parameter $P_{sens}$ to be determined, the magnetic field sensor-specific parameter $P_{sens}$ comprising a number $n_{konst}$ of unknown constant degrees of freedom dependent on the number of magnetic field sensors.

The method further includes solving the non-linear system of equations using the optimization or estimation method, obtaining as a result at least the unknown magnetic field sensor-specific parameter $P_{sens}$, and alternatively or additionally the magnetic field source-specific parameter $P_{mag}$, which is then used as the correction value(s) of the magnetic sensor system 200.

According to the non-limiting embodiment shown in FIG. 5, the step of varying the magnetic field of the magnetic field source 210 included varying the position and/or orientation of the magnetic field source 210 between the individual measurements, wherein the magnetic field source 210 is moved and the magnetic field sensor arrangement 220 remains static.

Here, the term "static" refers to the surrounding reference system. That is, the magnetic field source 210 is moved while the substrate 240 (e.g., PCB) is not moved.

Mathematically, the reference system can of course be changed, whereby, for example, a movement of the magnetic field source 210 in the sensor coordinate system would be equivalent to a movement of the magnetic field sensor arrangement 220 in the magnetic coordinate system. In this case, it is merely a relative movement of the magnetic field source 210 with respect to the magnetic field sensor arrangement 220, and it does not matter significantly here which of the two elements 210, 220 is movable or immovable. Depending on the type of relative movement, variable and constant degrees of freedom can occur.

From equation (1), it can be seen that the number $n_{var}$ of variable degrees of freedom enters the equation multiplicatively, whereas the number $n_{konst}$ of constant degrees of freedom enters the equation merely additively. This means a larger number $n_{var}$ of variable degrees of freedom has a significantly greater effect on the linear system of equations than a greater number $n_{konst}$ of constant degrees of freedom. Thus, it is advantageous to have as many constant degrees of freedom as possible.

For example, the magnetic field source 210 comprises three degrees of freedom with respect to its position (translation along x-, y-, z-axis) and three degrees of freedom with respect to its orientation (rotation about x-, y-, z-axis).

As discussed in the example in FIG. 5, the magnetic field source 210 was fixed or clamped in such a way that merely a movement along a single axis of translation was possible, i.e. there was only a single variable degree of freedom. The other five degrees of freedom were constant, due to the selected fixation of the magnetic field source 210.

Accordingly, possible embodiments of the present invention can thus provide that the magnetic field source 210 is fixed with respect to the magnetic field sensor arrangement 220 such that, when varying the position and/or the orientation of the magnetic field source 210 between the individual measurements, at least one degree of freedom with respect to the position (translation along x-, y-, z-axis) and/or at least one degree of freedom with respect to the orientation (rotation about x-, y-, z-axis) remains constant. As mentioned above, it is advantageous if as many degrees of freedom as possible remain constant.

As an alternative to the example shown in FIG. 5, it would also be possible in principle to move the magnetic field source 210 along defined curves or paths and to describe them appropriately in order to keep the number of variable degrees of freedom, i.e. the unknown kinematic magnetic field source-specific parameters $P_{mag}$ (e.g. position and/or orientation and/or velocity and/or acceleration of the magnetic field source 210 when varying the magnetic field), as small as possible.

According to a corresponding embodiment, it would thus be possible, for the purpose of varying the magnetic field of the magnetic field source 210, to place the magnetic field source 210 at different measurement positions relative to the magnetic field sensor arrangement 220 along a defined and known path.

Alternatively, it would be possible to place the magnetic field source 210 at arbitrary and not predefined measuring positions relative to the magnetic field sensor arrangement 220, but this would of course again increase the number $n_{var}$ of the variable degrees of freedom increases. However, this could then in turn be compensated by a correspondingly large number $n_{mess}$ of individual measurements to be performed, so that equation (1) would be fulfilled again.

For undefined movements, all six mechanical degrees of freedom (3x rotation, 3x translation) would have to be determined for each individual measurement. Therefore, more variables but fewer constants have to be determined. However, if enough individual measurements have been performed at different positions, equation (1) is again fulfilled and calibration can also be performed in accordance with the invention. It would only have to be ensured that the measurements entering the algorithm differ as much as possible so that the system of equations can be solved. For example, one could compare the field strengths and need a certain percentage change for each measurement. However, the prerequisite is that the magnetic field source 210 also moves significantly.

In the above embodiment, of the one or several magnetic field source-specific parameters $P_{mag}$ at least the dimensions of the magnetic field source 210, and/or
the magnetization vector M of the magnetic field source 210 were unknown before the individual measurements were performed.

In an alternative embodiment of the invention, the magnetic field source 210 can be precisely defined and calculated without unknown parameters $P_{mag}$. That is, one or several of the magnetic field source-specific parameters $P_{mag}$ can be known prior to performing the individual measurements.

For this purpose, for example, a previously measured reference magnet at known temperature and known magnetization vector $\vec{M}$ can be used as magnetic field source 210. This means that the dimensions of the magnetic field source 210, and/or the magnetization vector $\vec{M}$ of the magnetic field source 210 are known.

Here, the number of degrees of freedom to be determined can be reduced such that only a few variations are needed to calibrate the sensitivity matrix of the magnetic sensor system 200. Further, if the position and/or the orientation of the magnetic field source 210 relative to the magnetic field sensor arrangement 220 are known, exactly three measurements are sufficient for any number of vector-measurement 3D magnetic sensors 221, 222, since for each vector-measurement sensor:

$$n_{konst} = n_y * 3 = n_y * n_{mess} = 9 \quad (3)$$

A non-limiting example of this embodiment would be a calibration of an array (=magnetic field sensor arrangement 220) of 3D magnetic field sensors 221, 222 by means of placing a reference magnet (=magnetic field source 210) in a fixture that fixes the magnet 210 at a defined location and position relative to the magnetic field sensor array 220. The relative position of the magnetic field source 210 to the sensor array 220 would then be known, so that sensor error calibration could be performed based on the magnetic field at the location of the 3D magnetic field sensors 221, 222. To get three independent measurements, the magnetic field source 210 can now be rotated in its fixture about two of its axes. Alternatively or additionally, the array 220 could be translationally displaced in three steps. This embodiment would also be realizable with a magnetic field sensor array 220 having exactly one 3D magnetic field sensor 221.

FIG. 6 shows another non-limiting embodiment of the present invention. Here, the inhomogeneous magnetic field of an excitation conductor arrangement 210 with several excitation conductors 211, 212 is used for the calibration of the magnetic sensor system 200. That is, in this embodiment, the magnetic field source 210 is configured in the form of an excitation conductor arrangement.

Also in this embodiment, two magnetic field sensor arrays 220A, 220B are arranged on the substrate 240 as described above with reference to FIG. 5. In principle, a single magnetic field sensor arrangement would be sufficient to perform the method of the invention. Thus, insofar as the present disclosure refers to a magnetic field sensor arrangement 220, this can be understood to include the exemplarily illustrated two magnetic field sensor arrangements 220A, 220B, or even more magnetic field sensor arrangements. Thus, everything stated with reference to a magnetic field sensor arrangement 220 in general applies analogously in each case to both the first magnetic field sensor arrangement 220A and the second magnetic field sensor arrangement 220B.

In order to generate the inhomogeneous field as defined as possible with respect to the magnetic field sensor arrangements 220A, 220B, the individual excitation conductors 211, 212 can be deposited directly on the substrate 240 (e.g. PCB or printed circuit board). The excitation conductors 211, 212 can further be located in proximity to the magnetic field sensor arrangement 220.

The excitation conductor arrangement 210 can include a first excitation conductor 211 that can be disposed on a first side 271 of the substrate 240 (e.g., first board surface or board top side). The excitation conductor arrangement 210 can further comprise a second excitation conductor 212 that can be disposed on an opposite second side 272 of the substrate 240 (e.g., second board surface or board bottom side). The excitation conductors 211, 212 can further be galvanically connected to each other by means of a via 280 in at least one location of the substrate 240.

Each of the two excitation conductors 211, 212 can have two contacting terminals 281, 282, 283, 284, respectively, to which a current or voltage source can be connected. This can be a constant current source or a DC voltage source. However, it would also be possible that AC current or AC voltage sources are used.

In order to generate the different magnetic fields for the respective individual measurements, the four contacting terminals 281, 282, 283, 284 can each be connected in pairs successively to a current or voltage source. That is, a (constant) current can be applied to the contacting terminals 281, 282, 283, 284 in different combinations to thereby generate inhomogeneous magnetic fields in the region of the magnetic field sensor arrangement 220. In this embodiment, this is, so to speak, a calibration arrangement with switchable excitation conductors 211, 212, wherein the variation of the magnetic field of the magnetic field source 210 (at the location of the magnetic field sensor arrangement 220) can be effected by connecting the contacting terminals 281, 282, 283, 284 of the excitation conductors 211, 212 to each other in pairs.

The minimum condition from equation (3) also applies in this embodiment, so that the excitation conductors 211, 212 should be controlled in such a way that at least three different magnetic fields are generated successively. Due to the pairwise connection described, there are initially twelve different possible combinations, two of which differ only in the direction of the current flow. This leaves essentially six independent combinations. The minimum condition from equation (3) would thus be fulfilled. Three redundant measurements are available, which can be used to improve the accuracy or to determine further parameters in addition to the sensitivity matrix.

In order for the generated magnetic fields to differ more from each other in the individual measurements, thereby improving the observability or the accuracy of the calibration, the symmetry, i.e. the geometric shape, of the excitation conductors 211, 212 can differ from each other. In the non-limiting example of FIG. 6, for example, the second excitation conductor 212 on the bottom side 272 of the substrate 240 is shorter than the first excitation conductor 211 on the top side 271 of the substrate 240. With such a non-symmetrical arrangement of the individual excitation conductors 211, 212, the six independent connecting combinations of the contacting terminals 281, 282, 283, 284 result in a uniquely solvable system of equations.

The magnetic field of the excitation conductor arrangement 210 can be calculated analytically in dependence on the sensor characteristics. The magnetic field sensor-specific parameters $P_{sens}$ of the sensitivity and the tilting or offset of the magnetic field sensor arrangement 220 can thus be determined via an estimation/optimization algorithm. The offset of the magnetic field sensor arrangement 220 is essentially the position and orientation of the magnetic field sensor arrangement 220 on the substrate 240 (e.g., PCB or circuit board), i.e., a deviation that can occur due to assembly tolerances during soldering of the magnetic field sensor arrangement 220.

In contrast to conventional technology [11], not only the degrees of freedom defining the position of the magnetic field sensor arrangement 220 can be determined, i.e., the position (location and/or orientation) of the magnetic field sensor arrangement 220 as a magnetic field sensor-specific parameter $P_{sens}$ Rather, the present invention can be used to determine additional magnetic field sensor-specific parameters $P_{sens}$, such as the magnetic degrees of freedom of the magnetic field sensor arrangement 220, i.e., the sensitivities of the individual magnetic field sensors 221, 222 of the magnetic field sensor arrangement 220. In addition to the sensitivity (sensitivity matrix $S(\vec{p})$), the offset can be determined as a further additional magnetic field sensor-specific parameter $P_{sens}$ The procedure is as described above, i.e., a mathematical model of the setup can be calculated including one or several magnetic field sensor-specific parameters $P_{sens}$ and fitted to the measurements step by step in an optimization algorithm. Moreover, it is not mandatory to apply an alternating magnetic field, which is needed in [11]. In principle, this specification can also be integrated on an IC to determine the magnetic field sensor-specific parameters $P_{sens}$ (e g sensitivity and/or offset).

Thus, according to the invention, the variation of the inhomogeneous magnetic field of the magnetic field source 210 at the location of the magnetic field sensor arrangement 220, between two individual measurements each, can be achieved in different ways.

According to a first embodiment of the inventive method, this can be achieved, for example, by means of a change in the position and/or orientation of the magnetic field source 210 relative to the magnetic field sensor arrangement 220. This can be achieved, for example, by means of a defined movement of the magnetic field source 210, e.g. as part of an end-of-line test, or by means of a possibly undefined movement during operation. The latter would cause the measurement system to reach its final accuracy only after a certain initial phase.

According to a second embodiment of the inventive method, the variation of the inhomogeneous magnetic field of the magnetic field source 210 at the location of the magnetic field sensor arrangement 220 can be achieved, for example, by means of a different interconnection of excitation conductors 211, 212 of an excitation conductor arrangement 210.

Both embodiments of the invention can have an arrangement of several magnetic field sensors (at least two vector-measurement 221, 222 (FIG. 4B) or six scalar-measurement 221, ..., 226 (FIG. 4A) sensors as well as a magnetic source 210, which generates an inhomogeneous field in the area of the magnetic field sensors 211, 212.

With the invention described herein, it is possible to determine very accurate calibration values for the parameters (magnetic field sensor-specific parameters $P_{sens}$ and/or magnetic field source-specific parameters $P_{mag}$) of a magnetic sensor system 200 (e.g. with one or several Hall sensors) without much technical effort. The inventive method thus improves the accuracy of magnetic field-based measurement systems 200. This involves only a small permanent magnet or other source 210 of an inhomogeneous magnetic field that can be moved or switched in a suitable manner. Calibration can thus take place with very little apparatus effort, which in turn can mean a significant cost advantage.

In many applications, the invention allows calibration to be performed entirely in the installed condition (in situ). A magnetic series test of individual magnetic field sensor arrangements 220 as well as a complete magnetic sensor system 200 (with one or several magnetic field sensor arrangements 220A, 220B) can thus be omitted. In addition, further influencing factors can be compensated, which only arise during assembly, for example tilting of the magnetic field sensor arrangement 220 on the substrate 240 (e.g. PCB) or of the PCB 240 relative to the reference coordinate system in the final application. The temperature dependence of the parameters $P_{sens}$ and/or $P_{mag}$, in particular the sensitivity matrix S(p) and the offsets, can be tracked during operation with this approach. This significant added value compared to conventional technology is one of the most important advantages.

The invention can be used in all applications of magnetic field sensors to calibrate the same, for example in current sensor technology or quality control for magnetic components.

There are also particular advantages in position sensor technology applications where high accuracy is needed, and especially in position sensor technology applications where vector-measurement Hall sensors are used. Examples would be the detection of imbalances in washing machines or in PC input devices.

Instead of the analytical model, an artificial neural network could also be used to perform the inventive calibration described herein.

The above-described embodiments are merely illustrative for the principles of the present invention. It is understood that modifications and variations of the arrangements and the details described herein will be apparent to others skilled in the art. It is the intent, therefore, that the invention is limited only by the scope of the appended claims and not by the specific details presented by way of description and explanation of the embodiments herein.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus.

Some or all of the method steps may be performed by a hardware apparatus (or using a hardware apparatus), such as a microprocessor, a programmable computer or an electronic circuit. In some embodiments, some or several of the most important method steps may be performed by such an apparatus.

Depending on certain implementation requirements, embodiments of the invention can be implemented in hardware or in software. The implementation can be performed using a digital storage medium, for example a floppy disk, a DVD, a Blu-Ray disc, a CD, an ROM, a PROM, an EPROM, an EEPROM or a FLASH memory, a hard drive or another magnetic or optical memory having electronically readable control signals stored thereon, which cooperate or are capable of cooperating with a programmable computer system such that the respective method is performed. Therefore, the digital storage medium may be computer readable.

Some embodiments according to the invention include a data carrier comprising electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer.

The program code may, for example, be stored on a machine readable carrier.

Other embodiments comprise the computer program for performing one of the methods described herein, wherein the computer program is stored on a machine readable carrier. In other words, an embodiment of the inventive method is, therefore, a computer program comprising a program code for performing one of the methods described herein, when the computer program runs on a computer.

A further embodiment of the inventive method is, therefore, a data carrier (or a digital storage medium or a computer-readable medium) comprising, recorded thereon, the computer program for performing one of the methods described herein. The data carrier, the digital storage medium, or the computer-readable medium are typically tangible or non-volatile.

A further embodiment of the inventive method is, therefore, a data stream or a sequence of signals representing the computer program for performing one of the methods described herein. The data stream or the sequence of signals may, for example, be configured to be transferred via a data communication connection, for example via the Internet.

A further embodiment includes a processing means, for example a computer, or a programmable logic device, configured to or adapted to perform one of the methods described herein.

A further embodiment includes a computer having installed thereon the computer program for performing one of the methods described herein.

A further embodiment includes an apparatus or a system configured to transmit a computer program for performing at least one of the methods described herein to a receiver. The transmission may be electronic or optical, for example. The receiver may be a computer, a mobile device, a memory device or a similar device, for example. The apparatus or the system may include a file server for transmitting the computer program to the receiver, for example.

In some embodiments, a programmable logic device (for example a field programmable gate array, FPGA) may be used to perform some or all of the functionalities of the methods described herein. In some embodiments, a field programmable gate array may cooperate with a microprocessor in order to perform one of the methods described herein. Generally, the methods are performed by any hardware apparatus. This can be a universally applicable hardware, such as a computer processor (CPU) or hardware specific for the method, such as ASIC.

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

SOURCES

[1] EP0225493 A3
[2] EP0382290 A1
[3] U.S. Pat. No. 9,885,574 BB
[4] doi:10.1109/ISEMC.1995.523521
[5] doi:10.1109/TGE.1978.294576
[6] doi:10.1088/0957-0233/14/5/319
[7] doi:10.1109/TIM.2014.2302240
[8] doi:10.1109/19.377852
[9] EP1518131A1
[10] doi:10.1166/s1.2009.1074
[11] WO20002220 A1
[12] doi:10.1063/1.1883308
[13] DE102015203686 A1
[14] US2017261565 AA

The invention claimed is:

1. A method, comprising:
calibrating a magnetic sensor system with a calibration apparatus comprising at least one magnetic field source and a magnetic field sensor arrangement with several individual magnetic field sensors, the calibration apparatus:
performing a plurality of individual measurements, wherein each individual measurement provides a number of measurement values depending on the number of the individual magnetic field sensors, wherein the magnetic field of the at least one magnetic field source is varied at the location of the magnetic field sensor arrangement between two successive individual measurements,
determining, based on the measurement values and by applying an optimization or estimation method, one or more unknown magnetic field sensor-specific parameters and/or one or more magnetic field source-specific parameters, wherein the determined parameters are used as correction values of the magnetic sensor system by applying these correction values to future measurement results of the magnetic sensor system,
wherein the at least one magnetic field source is configured to generate an inhomogeneous magnetic field,
wherein the magnetic field source-specific parameters and the magnetic field sensor-specific parameters each comprise a certain number of variable degrees of freedom and a certain number of constant degrees of freedom, and
wherein the method further comprises performing a minimum number of individual measurements, wherein this minimum number of individual measurements to be performed depends on
the number of the measurement values determined by the magnetic field sensors, and
the number of the variable degrees of freedom of the magnetic field source-specific parameters and the magnetic field sensor-specific parameters, and
the number of the constant degrees of freedom of the magnetic field source-specific parameters and the magnetic field sensor-specific parameters wherein the minimum number of individual measurements is determined such that the following inequality is fulfilled:

$$n_{mess}*n_{var}+n_{konst} << n_y*n_{mess} \quad 5$$

with $n_{mess}$: number of individual measurements to be performed, $n_y$: number of measurement values determined by the magnetic field sensors per individual measurement carried out, $n_{var}$: number of the variable degrees of freedom of the magnetic field sensor-specific parameters and/or the magnetic field source-specific parameters, $n_{konst}$: number of constant degrees of freedom of the magnetic field sensor-specific parameters and/or the magnetic field source-specific parameters.

2. The method according to claim 1,
wherein the magnetic field sensor arrangement comprises:
at least six scalar-measurement magnetic field sensors, each magnetic field sensor having exactly one preferred direction sensitivity along which the respective magnetic field sensor is sensitive to a magnetic field, such that each scalar-measurement magnetic field sensor can measure the magnetic field in exactly one spatial direction, or
at least two 3D magnetic field sensors, each 3D magnetic field sensor having at least three preferred direction sensitivities along which the respective 3D magnetic field sensor is sensitive to a magnetic field, such that each 3D magnetic field sensor can measure the magnetic field in all three spatial directions.

3. The method according to claim 1,
wherein the one or more unknown magnetic field sensor-specific parameters to be determined comprise at least one parameter from the following group:
a zero point error (offset),
an individual preferred direction sensitivity of an individual magnetic field sensor,
an individual cross-sensitivity of an individual magnetic field sensor to magnetic fields that are different to the preferred direction sensitivity of the respective magnetic field sensor,
a position and/or orientation of the individual magnetic field sensors with respect to the component carrier on which the same are mounted.

4. The method according to claim 1,
wherein the magnetic field source-specific parameters comprise at least one parameter of the following group:
a position of the magnetic field source relative to the magnetic field sensor arrangement,
an orientation of the magnetic field source relative to the magnetic field sensor arrangement,
a specific magnetization vector of the magnetic field source describing a specific magnetization of the magnetic field source in all three spatial directions,
the dimensions of the magnetic field source.

5. The method according to claim 1, the method further comprising:
setting up a non-linear equation system $$S(\vec{p}) \cdot \vec{B}(\vec{x},\vec{M}) = \vec{y}$$

comprising:
a measurement vector y comprising the measurement values determined by the magnetic field sensors during the individual measurements, a mathematical model for describing the inhomogeneous magnetic field $\vec{B}(\vec{x},\vec{M})$ of the magnetic field source as a magnetic field source-specific parameter to be determined, said magnetic field source-specific parameter comprising a specific number of variable degrees of freedom and/or constant degrees of freedom, a mathematical model $S(\vec{p})$ for describing individual sensitives of the individual magnetic field sensors of the magnetic field sensor arrangement as an unknown magnetic field sensor-specific parameter to be determined, wherein said unknown magnetic field sensor-specific parameter comprises a number of unknown constant degrees of freedom depending on the number of magnetic field sensors, and solving the non-linear equation system by applying the optimization or estimation method, wherein, as a result, at least the unknown magnetic field sensor-specific field parameter is acquired, which is then used as one of the correction values for calibrating the magnetic sensor system.

6. The method according to claim 1,
wherein the step of varying the magnetic field of the magnetic field source includes that at least one of a position and an orientation of the magnetic field source is varied between two successive individual measurements,
wherein the magnetic field source is moved and the magnetic field sensor arrangement remains static.

7. The method according to claim 1,
wherein the step of varying the magnetic field of the magnetic field source includes that at least one of a position and an orientation of the magnetic field source is varied between two successive individual measurements,
wherein either the magnetic field source is placed relative to the magnetic field sensor arrangement at different predetermined measurement positions along a defined path, or
the magnetic field source is placed relative to the magnetic field sensor arrangement at arbitrary and not predetermined measurement positions.

8. The method according to claim 6,
wherein the magnetic field source comprises three degrees of freedom with respect to its position (translation along x-, y-, z-axis) and three degrees of freedom with respect to its orientation (rotation around x-, y-, z-axis),
wherein the magnetic field source is fixed with respect to the magnetic field sensor arrangement such that, when varying the position and/or the orientation of the magnetic field sensor between two successive individual measurements, at least one degree of freedom with respect to the position and/or at least one degree of freedom with respect to the orientation remains constant.

9. The method according to claim 1,
wherein at least
the dimensions of the magnetic field source and/or
the magnetization vector of the magnetic field source of the one or more magnetic field source-specific parameters are unknown prior to performing the individual measurements.

10. The method according to claim 1,
wherein one or more of the magnetic field source-specific parameters are known prior to performing the individual measurements.

11. The method according to claim 1,
wherein, as one of the magnetic field sensor-specific parameters, a position of the magnetic field sensor arrangement relative to the magnetic field source is known.

12. The method according to claim 10,
wherein exactly three individual measurements are sufficient as a minimum number of individual measurements to be carried out,
which can be acquired either by means of a rotation of the magnetic field source around at least two of its three axes of rotation,
or by means of three translational movements of the magnetic field sensor arrangement relative to the magnetic field source.

13. The method according to claim 1,
wherein the inhomogeneous magnetic field is generated by a cuboid permanent magnet acting as the magnetic field source.

14. The method according to claim 1,
wherein the inhomogeneous magnetic field is generated by an excitation conductor arrangement acting as the magnetic field source, wherein the excitation conductor arrangement is arranged on a common substrate together with the magnetic field sensor arrangement,
wherein the excitation conductor arrangement comprises a first excitation conductor and a second excitation conductor and wherein the first and second excitation conductors each comprise different symmetries.

15. The method according to claim 14,
wherein the first excitation conductor and the second excitation conductor each comprise two contacting terminals such that the excitation conductor arrangement comprises four different conducting terminals in total,
wherein the step of varying the magnetic field of the magnetic field source comprises a step of successively contacting different two of the total of four contacting terminals in pairs, wherein different inhomogeneous magnetic fields can be generated when contacting different pairs of contacting terminals.

16. The method according to claim 15,
wherein the step of contacting includes that a direct voltage signal or a constant current signal is applied to the respective contacting terminals.

17. The method according to claim 1,
wherein the method can be performed at the installation site of the magnetic field sensor as well as in an installed state of the magnetic sensor system.

18. A non-transitory digital storage medium having a computer program stored thereon to perform a method, comprising:
calibrating a magnetic sensor system with a calibration apparatus comprising at least one magnetic field source and a magnetic field sensor arrangement with several individual magnetic field sensors, the calibration apparatus:
performing a plurality of individual measurements, wherein each individual measurement provides a number of measurement values depending on the number of the individual magnetic field sensors, wherein the magnetic field of the magnetic field source is varied at the location of the magnetic field sensor arrangement between two successive individual measurements,
determining, based on the measurement values and by applying an optimization or estimation method, one or more unknown magnetic field sensor-specific parameters and/or one or more magnetic field source-specific parameters, wherein the determined parameters are used as correction values of the magnetic sensor system by applying these correction values to future measurement results of the magnetic sensor system,
wherein the at least one magnetic field source is configured to generate an inhomogeneous magnetic field,
wherein the magnetic field source-specific parameters and the magnetic field sensor-specific parameters each comprise a certain number of variable degrees of freedom and a certain number of constant degrees of freedom, and
wherein the method further comprises performing a minimum number of individual measurements, wherein this minimum number of individual measurements to be performed depends on
the number of the measurement values determined by the magnetic field sensors, and
the number of the variable degrees of freedom of the magnetic field source-specific parameters and the magnetic field sensor-specific parameters, and
the number of the constant degrees of freedom of the magnetic field source-specific parameters and the magnetic field sensor-specific parameters,
wherein the minimum number of individual measurements needed is determined such that the following inequality is fulfilled:

$$n_{mess} * n_{var} + n_{konst} << n_y * n_{mess}$$

with
$n_{mess}$: number of individual measurements to be performed,
$n_y$: number of measurement values determined by the magnetic field sensors per individual measurement carried out,
$n_{var}$: number of the variable degrees of freedom of the magnetic field sensor-specific parameters and/or the magnetic field source-specific parameters,
$n_{konst}$: number of constant degrees of freedom of the magnetic field sensor-specific parameters and/or the magnetic field source-specific parameters,
when said computer program is run by a computer.

19. An apparatus for calibrating a magnetic sensor system, comprising:
at least one magnetic field source, and
a magnetic field sensor arrangement comprising several individual magnetic field sensors,
the magnetic sensor system further comprising a calibration device configured to
perform a plurality of individual measurements, wherein each individual measurement provides a number of measurement values depending on the number of the individual magnetic field sensors, wherein the magnetic field of the magnetic field source is varied at the location of the magnetic field sensor arrangement between two successive individual measurements,
determine, based on the measurement values and by applying an optimization or estimation method, one or more unknown magnetic field sensor-specific parameters and/or one or more magnetic field source-specific parameters, wherein the determined parameters are used as correction values of the magnetic sensor system by applying these correction values to future measurement results of the magnetic sensor system, wherein the at least one magnetic field source is configured to generate an inhomogeneous magnetic field,
wherein the magnetic field source-specific parameters and the magnetic field sensor-specific parameters each comprise a certain number of variable degrees of freedom and a certain number of constant degrees of freedom, and
wherein the method further comprises performing a minimum number of individual measurements, wherein this minimum number of individual measurements to be performed depends on
the number of the measurement values determined the magnetic field sensors, and
the number of the variable degrees of freedom of the magnetic field source-specific parameters and the magnetic field sensor-specific parameters, and
the number of the constant degrees of freedom of the magnetic field source-specific parameters and the magnetic field sensor-specific parameters, wherein the minimum number of individual measurements needed is determined such that the following inequality is fulfilled:

$$n_{mess}*n_{var}+n_{konst}<<n_{y}*n_{mess}$$

with $n_{mess}$: number of individual measurements to be performed, $n_{y}$: number of measurement values determined the magnetic field sensors per individual measurement carried out, $n_{var}$: number of the variable degrees of freedom of the magnetic field sensor-specific parameters and/or the magnetic field source-specific parameters, $n_{konst}$: number of constant degrees of freedom of the magnetic field sensor-specific parameters and/or the magnetic field source-specific parameters.

* * * * *